US006816517B2

(12) United States Patent
Jacobowitz et al.

(10) Patent No.: US 6,816,517 B2
(45) Date of Patent: Nov. 9, 2004

(54) MICRO-ELECTROMECHANICAL DEVICES FOR WAVELENGTH TUNABLE LASERS

(75) Inventors: Lawrence Jacobowitz, Wappingers Falls, NY (US); Casimer M. DeCusatis, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 09/962,872

(22) Filed: Sep. 25, 2001

(65) Prior Publication Data

US 2003/0058901 A1 Mar. 27, 2003

(51) Int. Cl.[7] .............................................. H01S 3/10
(52) U.S. Cl. ........................... 372/20; 372/10; 372/21; 372/22; 372/23; 372/29.011; 372/29.02
(58) Field of Search ............................ 372/20, 21, 22, 372/23, 29.011, 29.02, 10, 12, 13, 14, 15

(56) References Cited

U.S. PATENT DOCUMENTS

| | | | | |
|---|---|---|---|---|
| 4,991,178 A | * | 2/1991 | Wani et al. ..................... 372/32 |
| 2002/0085806 A1 | * | 7/2002 | Pezeshki et al. .............. 385/31 |
| 2003/0007523 A1 | * | 1/2003 | Chapman et al. ............. 372/20 |
| 2003/0016707 A1 | * | 1/2003 | McDonald et al. ........... 372/20 |

OTHER PUBLICATIONS

Stamatios V. Kartalopoulos, "Introduction to DWDM Technology", IEEEE Communications Society, Sponsor, Chapter 3 pp. 67–68.
Robert Ban, Paul Apte, Adnreas Ostendorf, Klaus Korber, and Thorsten Temme "Micromachining System Accommodates Large Wafers" Laser Focus World, vol. 37 No. 1, Jan. 2001, pp. 3–5, 189–190 and 192.
John Carroll, James Whiteaway and Dick Plumb "Distributed Feedback Semiconductor Lasers" The Instsitue of Electrical Engineers APIE Optical Engineering Press, IEE Circuits, Devices and Systems Series 10, SPIE Press Monograph vol. PM52, 1989, pp. 9–15.
"Micromachining System Accommodates Large Wafers" Robert Bann et al., Laser Focus World, Jan. 2001, vol. 27 No. 1, pp. 189, 190 and 192.
"Introduction to DWDM Technology Data in a Rainbow", by Stamatios V. Kartalopoulos, Lucent Technologies, Inc., IEEE communications Society, Sponsor, SPIE Optical Engineering Press, pp. 67–68.
"Introduction to DWDM Technology Data in a Rainbow", by Stamatios V. Kartalopoulos, Chapter 9, pp. 131–136.
"Distributed feedback semiconductor lasers", by John Carroll, et al., IEE Circuits, Devices and Systems Series 10, SPIE Press Monograph vol. PM52, 1998, pp. 7–15.
"Micromachining System Accommodates Large Wafers" Robert Bann et al., Laser Focus World, Jan. 2001, vol. 27 No. 1, pp. 189, 190 and 192.

* cited by examiner

*Primary Examiner*—Paul Ip
*Assistant Examiner*—Armando Rodriguez
(74) *Attorney, Agent, or Firm*—Scully, Scott, Murphy & Presser; Tiffany L. Townsend, Esq.

(57) ABSTRACT

An arrangement for tuning a micro-electro-mechanical (MEM) laser center wavelength to exactly match the passband of its associated filter. A dither wavelength locked feedback loop dynamically adjusts the position of the MEM element, and hence the laser, wavelength, to keep it nominally centered at the filter passband peak. The dither wavelength locked feedback loop compensates for many internal variables of the laser, filter, and the MEM with a single mechanism that stabilizes the laser and locks the wavelength to any desired value.

16 Claims, 5 Drawing Sheets

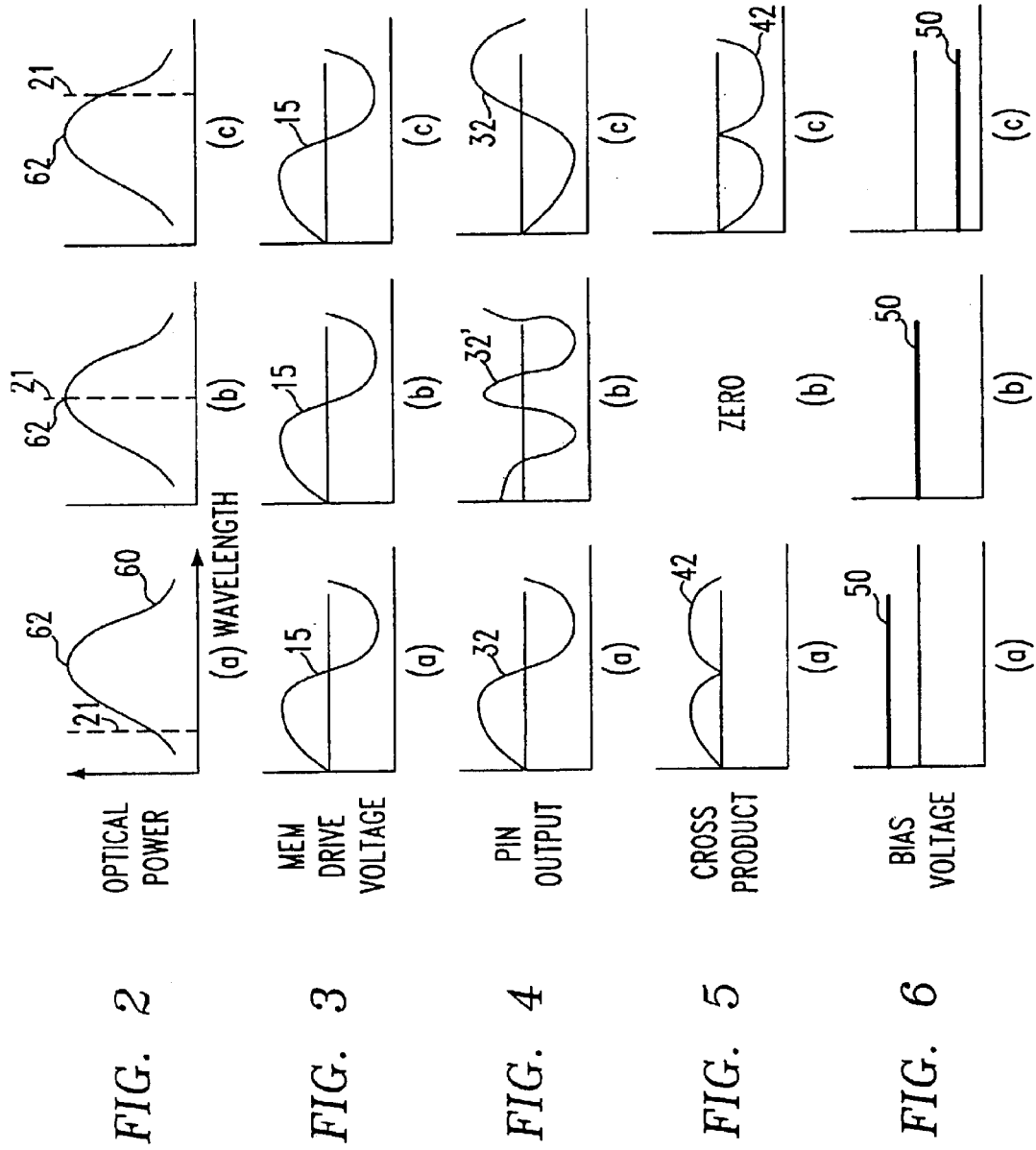

MICRO-ELECTROMECHANICAL DEVICES FOR WAVELENGTH TUNABLE LASERS

BACKGROUND OF THE INVENTION

1. Field of the Invention

The present invention relates generally to micro-electromechanical (MEM) devices for wavelength tunable lasers, and more particularly pertains to micro-electromechanical devices for wavelength tunable lasers which control the laser wavelength to match a wavelength selective device such as an external filter as required for a given application by using a dither wavelength locked feedback loop connected to the MEM device.

2. Discussion of the Prior Art

In recent years, micro-electromechanical devices or MEMs have matured into a viable technology for both electrical and optical communication systems. In particular, MEM devices can be used to build lasers with tunable wavelengths, also known as frequency agile lasers. This is especially important for dense wavelength division multi-plexing (DWDM) systems which typically require from 32 to 64 wavelengths today and may require hundreds of wavelengths in the future. Today, each wavelength must be generated by a different laser, which in turn means a large number of part numbers and cards which must be tracked in ordering and manufacturing systems, or held in inventory as field replacement spares. Furthermore, cards must be swapped in order to reconfigure a network, such as a meshed ring network, with wavelength reuse.

The explanations herein discuss both wavelength and frequency, which have a reciprocal relationship ($\lambda=c/f$, where c=speed of light), as is well known in the field of optics.

Wavelength Division Multiplexing (WDM) and Dense Wavelength Division Multiplexing (DWDM) are light-wave application technologies that enable multiple wavelengths (colors of light) to be paralleled into the same optical fiber with each wavelength potentially assigned its own data diagnostics. Currently, WDM and DWDM products combine many different data links over a single pair of optical fibers by re-modulating the data onto a set of lasers, which are tuned to a very specific wavelength (within 0.8 nm tolerance, following industry standards). On current products, up to 32 wavelengths of light can be combined over a single fiber link with more wavelengths contemplated for future applications. The wavelengths are combined by passing light through a series of thin film interference filters, which consist of multi-layer coatings on a glass substrate, pigtailed with optical fibers. The filters combine multiple wavelengths into a single fiber path, and also separate them again at the far end of the multiplexed link. Filters may also be used at intermediate points to add or drop wavelength channels from the optical network.

Ideally, a WDM laser would produce a very narrow linewidth spectrum consisting of only a single wavelength, and an ideal filter would have a square bandpass characteristic of about 0.4 nm width, for example, in the frequency domain. In practice, however, every laser has a finite spectral width, which is a Gaussian spread about 1 to 3 nm wide, for example, and all real filters have a Gaussian bandpass function. It is therefore desirable to align the laser center wavelength with the center of the filter passband to facilitate the reduction of crosstalk between wavelengths, since the spacing between WDM wavelengths are so narrow. In commercial systems used today, however, it is very difficult to perform this alignment—lasers and filters are made by different companies, and it is both difficult and expensive to craft precision tuned optical components. As a result, the systems in use today are far from optimal; optical losses in a WDM filter can be as high as 4 db due to misalignment with the laser center wavelength (the laser's optical power is lost if it cannot pass through the filter). This has a serious impact on optical link budgets and supported distances, especially since many filters must be cascaded together in series (up to 8 filters in current designs, possibly more in the future). If every filter was operating at its worst case condition (worst loss), it would not be possible to build a practical system. Furthermore, the laser center wavelengths drift with voltage, temperature, and aging over their lifetime, and the filter characteristics may also change with temperature and age. The laser center wavelength and filter bandwidth may also be polarization dependent. This problem places a fundamental limit on the design of future WDM networking systems.

A second, related problem results from the fact that direct current modulation of data onto a semiconductor laser diode causes two effects, which may induce rapid shifts in the center wavelength of the laser immediately after the onset of the laser pulse. These are (1) frequency chirp and (2) relaxation oscillations. Both effects are more pronounced at higher laser output powers and drive voltages, or at higher modulation bit rates. Not only can these effects cause laser center wavelengths to change rapidly and unpredictably, they also cause a broadening of the laser linewidth, which can be a source of loss when interacting with optical filters or may cause optical crosstalk. Avoiding these two effects requires either non-standard, expensive lasers, external modulators (which are lossy and add cost), or driving the laser at less than its maximum power capacity (which reduces the link budget and distance). Lowering the data modulation rate may also help, but is often not an option in multi-gigabit laser links.

It would thus be highly desirable to provide a stable, optimal alignment between a laser center wavelength and the center of a Gaussian bandpass filter in order to optimize power transmission through such fiber optic systems and reduce optical crosstalk interference in optical networks.

SUMMARY OF THE INVENTION

Accordingly, it is a primary object of the present invention to provide micro-electromechanical (MEM) devices for wavelength tunable lasers which utilize a dither wavelength locked feedback loop which compensates for many internal variables of the laser, a wavelength selective device such as filter, and the MEM with a single mechanism that stabilizes the laser and locks the wavelength to any desired value.

The present invention concerns wavelength selective devices which encompass wavelength selective devices of all types including filters of all types including comb filters, etalon filters and rotatable disc filters and wavelength selective gratings of all types including Bragg gratings and array waveguide gratings.

It is an object of the present invention to provide a servo-control "wavelength-locked loop" circuit that enables real time mutual alignment of an electromagnetic signal having a peaked spectrum function including a center wavelength and a wavelength selective device implementing a peaked passband function including a center wavelength, in a system employing electromagnetic waves.

It is another object of the present invention to provide a servo-control system and methodology for WDM and DWDM systems and applications that is designed to optimize power through multi-gigabit laser/optic systems.

It is a further object of the present invention to provide a wavelength-locked loop for an optical system that enables real time alignment and tracking of any spectral device that selects a wavelength, such as a Bragg grating, in optical fibers and waveguides, etc., for use in WDM systems.

It is yet another object of the present invention to provide a servo/feedback loop for an optical system, referred to as a "wavelength-locked loop," that enables real time alignment of a laser with variable optical attenuators by offsetting an optical filter from a known transmission in optical fibers and waveguides, etc.

It is yet a further object of the present invention to provide a servo/feedback loop for an optical system, referred to as a "wavelength-locked loop," that may be used in light polarization applications.

It is still another object of the present invention to provide a servo/feedback loop for an optical system, referred to as a "wavelength-locked loop," that enables real time alignment and tracking of laser center wavelengths and filter passband center wavelengths in multi-gigabit laser/optical systems such that the optical loss of a WDM filter/laser combination is greatly reduced, thereby enabling significantly larger link budgets and longer supported distances.

It is yet still another object of the present invention to provide a servo/feedback loop for an optical system, referred to as a "wavelength-locked loop," that enables real time alignment and tracking of laser center wavelengths and filter passband center wavelengths in multi-gigabit laser/optical systems such that lower cost lasers and filters may be used providing a significant cost reduction in the WDM equipment.

When employed in laser/optical networks, the system and method of the present invention may be used to tune laser diode devices, and/or compensate for any type of wavelength-selective element in the network, including wavelength selective filters, attenuators, and switches, in fiber Bragg gratings, ring resonators in optical amplifiers, external modulators such as acousto-optic tunable filters, or array waveguide gratings. This applies to many other optical components in the network as well (for example, optical amplifiers that may act as filters when operating in the nonlinear regime). Furthermore, the system and method of the invention may be used to implement less expensive devices for all of the above application areas.

Alternately, the system and method of the invention may be implemented to tune such devices for WDM and optical network applications, in real-time, during manufacture, e.g., tuning all lasers to a specific wavelength. This would significantly increase lot yields of laser devices which otherwise may be discarded as not meeting wavelength specifications as a result of manufacture process variations, for example.

The wavelength locked loop of the present invention enables a tighter control of wavelength, which allows an increased density of wavelength channels with less cross talk between channels in a wavelength multiplex system, which might typically include 32 or 64 channels or links. Pursuant to the present invention, each channel includes a separate wavelength locked loop which includes a separate source such as a laser and wavelength selective device such as a filter. Accordingly a wavelength multiplex system can include an array of 32 or 64 lasers and an array of 32 or 64 filters.

BRIEF DESCRIPTION OF THE DRAWINGS

The foregoing objects and advantages of the present invention for micro-electromechanical devices for wavelength tunable lasers may be more readily understood by one skilled in the art with reference being had to the following detailed description of several embodiments thereof, taken in conjunction with the accompanying drawings wherein like elements are designated by identical reference numerals throughout the several views, and in which:

FIGS. 2(a)–2(c) are signal waveform diagrams depicting the relationship between laser optical power as a function of wavelength for three instances of optic laser signals;

FIGS. 3(a)–3(c) are signal waveform diagrams depicting the laser diode drive voltage dither modulation (a sinusoid) for each of the three waveform diagrams of FIGS. 2(a)–2(c);

FIGS. 4(a)–4(c) are signal waveform diagrams depicting the resulting feedback error signal output of the PIN diode for each of the three waveform diagrams of FIGS. 2(a)–2(c);

FIGS. 5(a)–5(c) are signal waveform diagrams depicting the cross product signal resulting from the mixing of the amplified feedback error with the original dither sinusoid;

FIGS. 6(a)–6(c) are signal waveform diagrams depicting the rectified output laser bias voltage signals which are fed back to adjust the laser current and center frequency;

DETAILED DESCRIPTION OF THE DRAWINGS

Figure 1A:
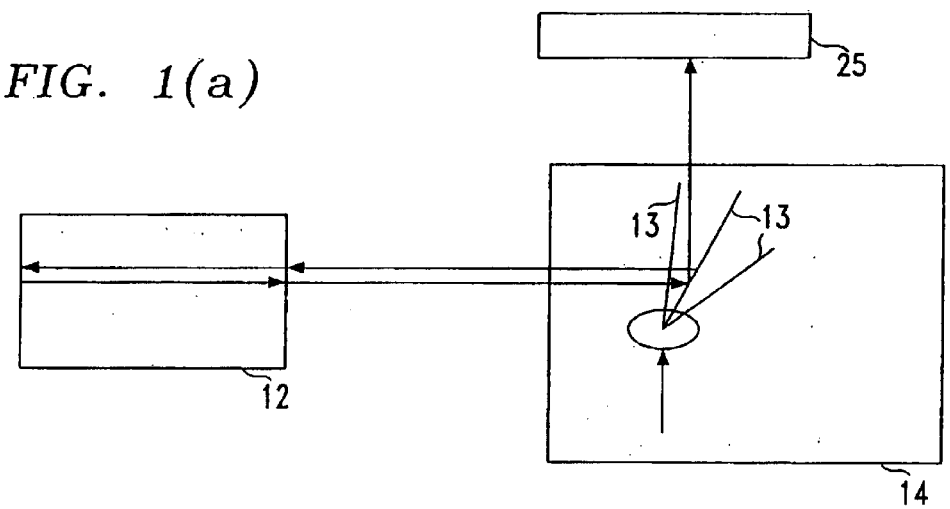
FIG. 1(a) illustrates a MEM device fabricated as a levered structure facing one end of a semiconductor laser diode cavity.

The present invention provides a novel servo-control system implemented for optical systems including light sources, such as lasers, and frequency selective devices, such as bandpass filters. The servo-control system, herein referred to as the "wavelength-locked loop" or "lambda-locked loop" (since the symbol lambda is commonly used to denote wavelength), implements a dither modulation to continuously adjust an electromagnetic signal source characterized as having a peaked frequency spectrum or peaked center wavelength, e.g., laser light, so as to track the center of a frequency selective device, e.g. a filter passband. In this manner, optimal power of the signal is transmitted and optimal use is made of the system transmission bandwidth.

The present invention provides a laser whose output wavelength can be tuned over a range of wavelengths. If the laser tuning is fast enough, data can be modulated onto the laser light. Even the ability to slowly tune a laser over 2–4 different wavelengths has benefits, including simplified implementation of coarse WDM systems for data communications channels such as Gigabit Ethernet. Tunability can take many alternate embodiments; for example, the MEM could be integrated with a thin coating of an organic material such as Parylene, which is electrically birefringent, to produce a switch that is both mechanical and polarization sensitive.

The wavelength of a laser is determined, in part, by the length of its resonant cavity. A micro-machined element such as a MEM can be placed at one end of a semiconductor laser cavity with a mirrored coating, wherein moving the MEM position changes the length of the laser cavity and hence the resonant wavelength of the laser.

There are various configurations for these devices; the MEM could be an angled mirror at the laser cavity end face, for example, or it could be a mirror fixed at both of its ends which flexes towards its middle. The addition of a MEM outside the laser cavity also induces noise, which derives from the fact that there are now 3 cavities in the system; one between the laser back and front facets, a second between the laser back facet and the MEM, and a third between the laser front facet and the MEM. This system is quite complex, and can be described by a set of coupled cavity equations.

The net effect of such a system is to produce spurious wavelengths in addition to the desired wavelength, which must be filtered out. This is commonly done by placing an optical filter in series with a micromachined laser. In a WDM system, this filter could be the same filter used for multiplexing; for non-WDM applications, a separate filter can be included with a number of passbands, set at the nominal positions of the tunable laser wavelengths. In order to achieve the highest possible optical power output at each tuned wavelength, the laser center wavelength for each tuning point must be precisely aligned with the center passband of its corresponding filter. There is currently no practical way to do this, and this problem inhibits the development of tunable lasers with their associated cost savings.

The present invention provides an arrangement for tuning a MEM laser center wavelength to exactly match the passband of its associated filter bank. This is accomplished by a dither wavelength locked feedback loop that dynamically adjusts the position of the MEM element, and hence the laser wavelength, to keep it nominally centered at the filter passband peak (this is possible because, in practice, all real filters have a Gaussian rolloff rather than a sharp band edge).

Micro-electromechanical (MEM) devices, also known as micromachines, can be fabricated on the same substrate as a semiconductor laser diode. FIG. 1(a) illustrates a MEM device 14 fabricated as a levered structure 13 facing one end of a semiconductor laser diode 12 cavity. External control logic can generate an external control voltage which is applied to the MEM device to cause the lever 13 to change its angular position, as illustrated schematically by the three angular positions shown in FIG. 1(a); if its surface is coated with a reflective media making it suitable as a laser mirror, then the MEM device can form an external optical cavity in addition to the laser diode. FIG. 1(a) illustrates the MEM device 14 reflecting the laser beam along an optical path to an associated wavelength filter 25.

In a Fabry-Perot type laser diode, the ends of a semiconductor cavity are polished and coated to form mirrors that provide optical feedback and hence enable lasing action to occur. In order for laser resonance to occur, an integral number of half-wavelengths of light must be exactly defined between the end boundaries of the laser cavity. In practice, this is complicated by many factors including the gain profile within the laser cavity, the presence and nature of dielectric charge at the mirrors, the presence of free carriers which cause a local reduction in the refractive index, and by local increases in temperature which may affect the refractive index as well. In general, though, the laser mode spacing is inversely proportional to the cavity length, and the condition for longitudinal resonance is given by $$k\lambda/2 = n L$$

where k is the longitudinal mode number, $\lambda$ is the free space wavelength of the laser light, n is the group refractive index of the semiconductor at this wavelength, and L is the length of the laser cavity. In terms of free space wavelength, the wavelength spacing between adjacent modes is then given by $$\Delta\lambda = \lambda^2/2n L$$

As an example, for gallium arsenide (GaAs) devices, n=4 and a laser with a cavity length of 500 microns would have a delta lambda ($\Delta\lambda$) of about 0.2 nm. Similar functional relationships hold for distributed feedback and other types of laser diodes. Note that if an external mirror such as a MEM mirror is placed outside the laser cavity, the problem becomes more complex, and there are now three cavities to consider, (1) the original semiconductor laser cavity, (2) the cavity formed by the external mirror and the near facet of the laser, which does not contain the gain medium, and (3) the cavity formed by the external mirror and the far facet of the laser, which partially contains the gain medium. The MEM mirror will reflect some coherent light back into the laser diode, causing noise effects such as relative intensity noise (RIN) within the laser cavity; other complicating effects, such as intermodal noise, can also arise. Different modes can exist in each one of these cavities, and in some cases these modes can interfere with one other. Also, note that in the case of a MEM device, one mirror facet can be adjusted in position, effectively increasing or decreasing the cavity length and thus controlling the laser wavelength and spacing between adjacent modes. In principle, this technique can be used to tune the wavelength of the laser while maintaining near constant optical output power. As seen from the above equations, though, such a laser system will exhibit multiple longitudinal modes with variable intermodal spacing.

The quality of the output laser light beam can be improved by placing a wavelength selective filter 25 in the path of the output beam, designed to block all but a desired subset of wavelengths. However, it is very difficult to manufacture wavelength selective optical filters which closely match the desired center wavelength of the laser diode, due to the various complicating factors noted earlier. Hence, practical systems exhibit very high optical loss and have a wavelength tuning range limited by the relationship between the MEM cavity laser and the optical filter. In addition, these systems can suffer from sensitivity to temperature, shock, and vibration, all of which cause unwanted movement in the MEM mirror and undesired changes in the laser wavelength.

The present invention compensates for these effects, and tightly controls the laser wavelength to match an external filter as required for a given application. The present invention provides such control by using a dither wavelength locked feedback loop connected to the MEM device.

Figure 1B:
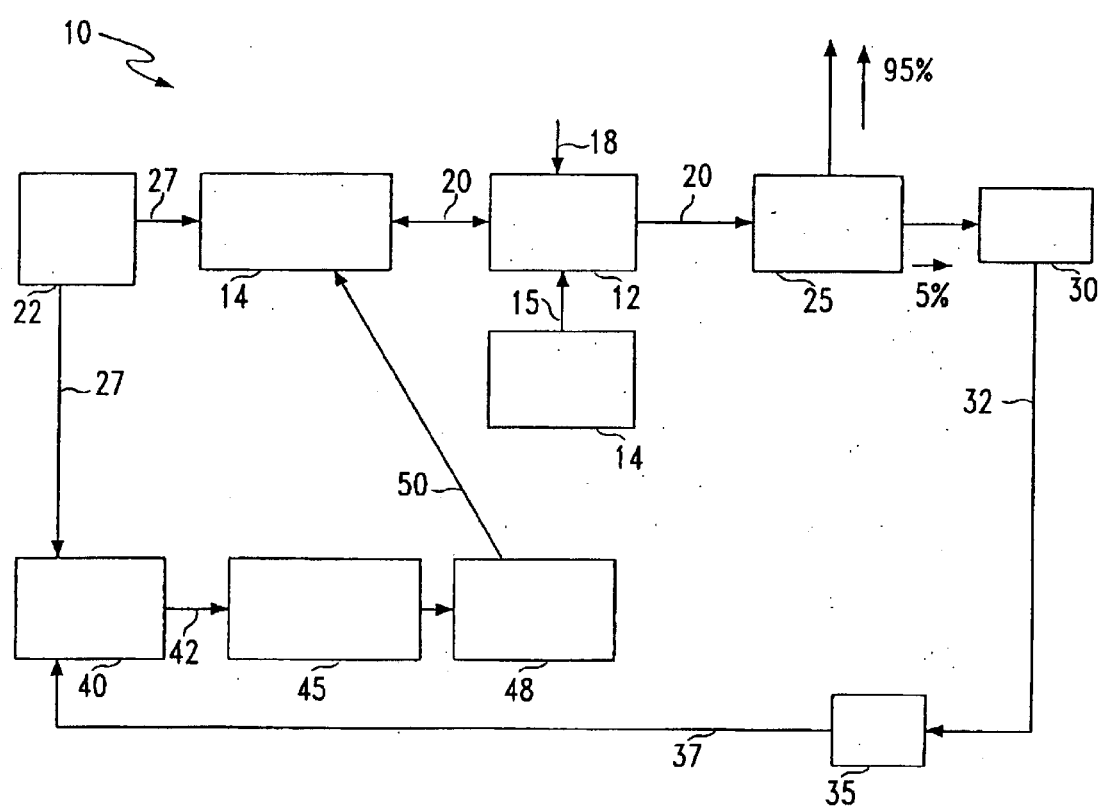
FIG. 1(b) illustrates a wavelength tunable laser diode defining a laser cavity, the output of which is incident on a variable position MEM which tunes the wavelength of the laser diode by using a dither wavelength locked feedback loop.

FIG. 1(b) illustrates a wavelength tunable laser diode 12 defining a laser cavity, the output of which is incident on a variable position MEM 14 positioned external to the laser cavity which tunes the wavelength of the laser diode by using a dither wavelength locked feedback loop. The laser diode output laser beam may optionally be modulated with data as in a WDM or non-WDM communication system. The output laser beam is then passed through one or more bandpass filters 25 and a laser beam splitter which directs most (e.g. 95%) of the laser beam to an output and directs a small portion thereof (e.g. 5%) to a PIN photodiode detector 30 in a dither wavelength locked feedback loop.

The MEM is actuated by a sinusoidal dither drive signal from an external sinusoidal dither drive source 22. This can be done at a very low frequency (kHz or less) to avoid interference with other aspects of the system and to avoid excessive wear on the MEM. It is important that the MEM modulation frequency be kept fairly low, to avoid excessive spectral broadening (multinode operation) of the laser diode.

In practice, the feedback loop described herein can also be used to compensate for other movements of the MEM due to mechanical shocks or thermal changes as described earlier. The dither introduced is generally dominant over these effects.

The position of the MEM oscillates at the dither frequency about a nominal angular position; this periodic change in the laser cavity length introduces a corresponding change in the laser wavelength. FIG. 1(b) illustrates that the emerging light beam travels through one or more optical bandpass filters 25, and a small fraction of it (5%) is diverted by a beam splitter B/S to a photodiode 30. The bandpass filter(s) 25 may be realized with various technologies, including thin film interference filters and array waveguide gratings.

The photodiode 30 output current is proportional to the dither modulation of the light intensity which is produced after the dithered optical wavelength has passed through the bandpass filter(s) 25. The photodiode output is amplified by an amplifier 35 and is then mixed with the original dither signal in a multiplier 40 to produce a vector cross product The output of the multiplier is then filtered at 45 to pass the vector cross product, which is then integrated, and preferably digitized, at 48 to produce a feedback signal that indicates to the MEM wavelength control 14 whether the laser center wavelength is aligned with the filter center wavelength, and if not in what direction and by what amount the wavelength must be shifted or changed to be brought into alignment with the center wavelength of the bandpass filter(s) 25.

Technically, the multiplication with the original dither signal is used to detect the relative phase of the signal, which is determined by the local slope of the wavelength passband; feedback through an integrator can then follow the slope to the peak of the passband. This feedback signal is an important element of the present invention as it enables a digital logic control circuit to reposition the MEM by the correct amount and in the proper direction to shift or change the laser wavelength, bringing it into closer alignment with the center wavelength of the filter passband. Since this is an active feedback process, it can be used to correct for changes in the laser or filter properties such as those caused by ageing or temperature changes.

The feedback loop is stable for a wide range of conditions, and may be implemented as a variant on an externally excited adaptive loop design familiar from control systems theory. Note that the feedback loop acts as a high level state machine, compensating for all of the internal variables (wavelength selectivity) of the laser diode, filter, and the MEM with a single mechanism that stabilizes the laser and locks the wavelength to any desired value.

Further, the laser can easily be tuned in wavelength to another desired wavelength by this feature. It is estimated that a tuning range of 5 to 20 nm is achievable using current technology.

The wavelength-locked loop (WLL) is now described in firer detail with reference to FIGS. 1(b) and 2–9. The basic operating principle of the wavelength-locked loop (WL) is described in greater detail in commonly-owned, co-pending U.S. patent application Ser. No. 09/865,256, entitled APPARATUS AND METHOD FOR WAVELENGTH-LOCKED LOOPS FOR SYSTEMS AND APPLICATIONS EMPLOYING ELECTROMAGNETIC SIGNALS, the whole contents and disclosure of which is incorporated by reference as if fully set forth herein.

FIG. 1(b) depicts an exemplary optical system 10 including a light source such as laser diode 12 driven with both a bias voltage 15 from a voltage bias circuit 14 and modulated data 18 from a data source (not shown). The laser diode generates an optical (laser light) signal 20 that is received by a bandpass filter 25, or any frequency selective device including but not limited to: thin film optical interference filters, acousto-optic filters, electro-optic filters, diffraction gratings, prisms, fiber Bragg gratings, integrated optics interferometers, electroabsorption filters, and liquid crystals. The laser diode itself may comprise a standard Fabry Perot or any other type (e.g., Vertical Cavity Surface Emitting (VCSEL)), light emitting diodes, or, may comprise a Distributed Feedback semiconductor laser diode (DFB) such as commonly used for wavelength multiplexing. Preferably, the laser diode emits light in the range of 850 nm to 1550 nm wavelength range. As mentioned, the bandpass filter may comprise a thin film interference filter comprising multiple layers of alternating refractive indices on a transparent substrate, e.g., glass.

As further shown in FIG. 1(b), according to the invention, there is an added sinusoidal dither modulation circuit or oscillator 22 for generating a sinusoidal dither modulation that modulates the MEM wavelength control 14. The sinusoidal dither signal varies the micro-electromechanical system's (MEMS) mirror to vary the wavelength. The dither modulation frequency is on the order of a few kilohertz (kHz) but may range to the Megahertz range. Preferably, the dither modulation frequency is much less than the data rate which is typically on the order of 1–10 GHz. Modulation of the MEM wavelength control in this manner causes a corresponding dither in the laser center wavelength. Modulated data is then imposed on the laser, and the optical output passes through the bandpass filter 25. Preferably, the filter 25 is designed (e.g. with a beam splitter B/S) to tap off a small amount of light, for example, which is incident upon a photo detector receiver device, e.g., PIN diode 30, and converted into an electrical feedback signal 32. The amount of light that may be tapped off may range anywhere between one percent (1%) to five percent (5%) of the optical output signal, for example, however, skilled artisans will appreciate any amount of laser light above the noise level that retains the integrity of the output signal including the dither modulation characteristic, may be tapped off. The remaining laser light passes on through the filter 25 to the optical network (not shown). As the PIN diode output 32 is a relatively weak electric signal, the resultant feedback signal is amplified by amplifier device 35 to boost the signal strength. The amplified electric feedback signal 37 is input to a multiplier device 40 where it is combined with the original dither modulation signal 27. The cross product signal 42 that results from the multiplication of the amplified PIN diode output (feedback signal) 37 and the dither signal 27 includes terms at the sum and difference of the dither frequencies. The result is thus input to a low pass filter device 45 where it is low pass filtered and then averaged by integrator circuit 48 to produce an error signal 50 which is positive or negative depending on whether the laser center wavelength is respectively less than or greater than the center point of the bandpass filter. The error signal 50 is input to the MEM wavelength control 15. In this manner, the laser wavelength will increase or decrease until it exactly matches the center of the filter passband. Alternately, the error signal 50 may be first converted to a digital form prior to input to the MEM wavelength control.

According to one aspect of the invention, the WLL will automatically maintain tracking of the laser center wavelength to the peak of the optical filter. However, in some cases, it may not be desirable to enable laser alignment to the filter peak, e.g., in an optical attenuator. Thus, as shown in the embodiment depicted in FIG. 8, there is provided an optional external tuning circuit, herein referred to as a wavelength shifter device 51, that receives the error signal and varies or offsets it so that the laser center wavelength may be shifted or offset in a predetermined manner according to a particular network application. That is, the wavelength shifter 51 allows some external input, e.g., a manual control element such as a knob, to introduce an arbitrary, fixed offset between the laser center wavelength and the filter peak.

Figure 7:
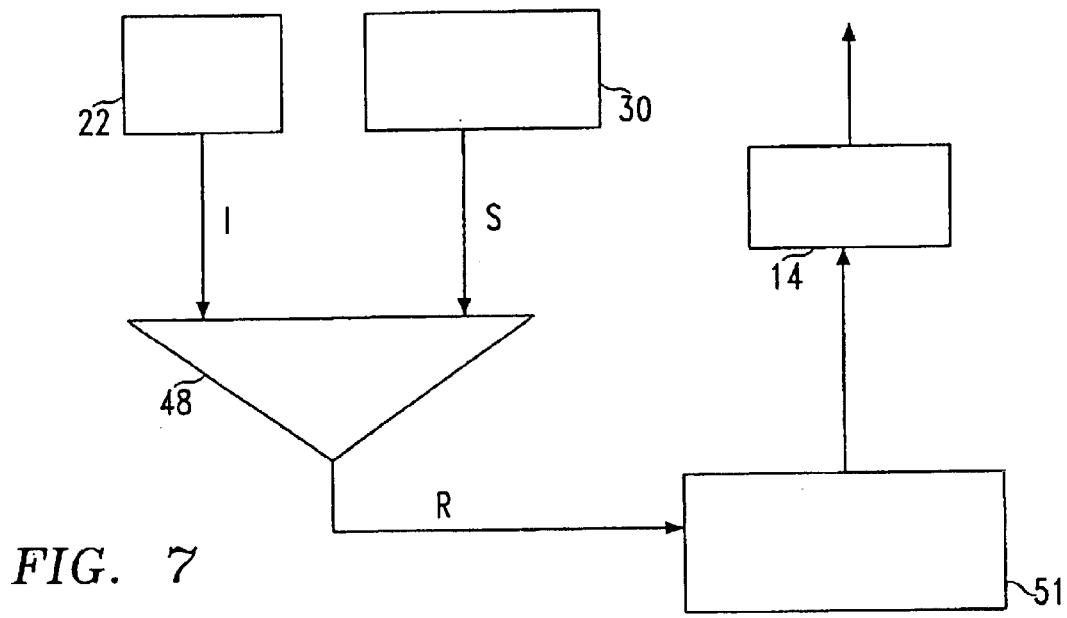
FIG. 7 is a generalized circuit diagram depicting how dithering is implemented in the WLL system of the present invention.

A generalized description of how dithering is implemented for providing a WLL in the present invention is now provided in view of FIG. 7. As shown in FIG. 7, the sinusoidal dither generator (harmonic oscillator) 22 produces a dither signal 27 which causes the laser center wavelength to oscillate with a small amplitude about its nominal position. After passing thru the optical bandpass filter, the laser wavelength variation is converted into intensity variation which is detected by the photodetector circuit 30 (e.g., photodiode). The servo loop feeds back the photodiode output signal, S, and takes a vector cross product with the original sinusoidal dither, I. The cross product result is averaged (integrated) over a time period T and may be sampled and digitized to produce the equivalent of an error detect signal, R, which is bipolar and proportional to the amount by which the laser center wavelength and filter center wavelength are misalignment. Optionally, the signals may be normalized to account for variations in the laser power output from the filter. Optionally, an external tuning circuit may be implemented to receive the error signal and enable the laser center wavelength offset to vary to an arbitrary value. Finally, the error signal R is fed back used by the MEM wavelength control 14 to adjust the laser center wavelength in the proper direction to better align with the filter center wavelength.

The operating principle is further illustrated in the timing and signal diagrams of FIGS. 2–6. FIGS. 2(a)–2(c) particularly depicts the relationship between laser optical power as a function of wavelength for three instances of optic laser signals. A first instance (FIG. 2(a)) where the laser signal frequency center point 21 is less than the bandpass function centerpoint as indicated by the filter bandpass function 60 having centerpoint 62 as shown superimposed in the figures; a second instance (FIG. 2(b)) where the laser frequency center point 21 is aligned with the bandpass function centerpoint 62; and, a third instance (FIG. 2(c)) where the laser frequency center point 21 is greater than the bandpass function centerpoint 62. In each instance, as depicted in corresponding FIGS. 3(a)–3(c), the MEM drive voltage signal 15 is shown dithered (a sinusoid) resulting in the laser wavelength dithering in the same manner. The dithered laser diode spectra passes through the filter, and is converted to electrical form by the PIN diode 30. In each instance of the laser signals depicted in FIGS. 2(a) and 2(c) having frequency centerpoints respectively less than and greater than the band pass filter centerpoint, it is the case that the dither harmonic spectra does not pass through the frequency peak or centerpoint of the bandpass filter. Consequently, the resulting output of the PIN diode is an electric sinusoidal signal of the same frequency as the dither frequency such as depicted in corresponding FIGS. 4(a) and 4(c). It is noted that for the laser signals at frequencies below the peak (FIG. 2(a)) the feedback error signal 32 corresponds in frequency and phase to the dither signal (FIG. 4(a)), however for the laser signals at frequencies above the peak (FIG. 2(c)) the feedback error signal 32 corresponds in frequency but is 180° opposite phase of the dither signal (FIG. 4(c)). Due to the bipolar nature of the feedback signal (error signal) for cases when the laser signal centerpoint is misaligned with the bandpass filter centerpoint, it is thus known in what direction to drive the MEM (magnitude and direction), which phenomena may be exploited in many different applications. For the laser signal depicted in FIG. 2(b) having the laser frequency center point aligned with the bandpass function centerpoint, the dither harmonic spectra is aligned with and passes through the frequency peak (maximum) of the bandpass filter twice. That is, during one cycle (a complete round trip of the sinusoid dither signal), the dither signal passes though the centerpoint twice. This results in a frequency doubling of the dither frequency of the feedback signal 32, i.e., a unique frequency doubling signature, as depicted as PIN diode output 32' in FIG. 4(b) showing a feedback error signal at twice the frequency of the dither frequency.

Thus, in each instance, as depicted in corresponding FIG. 4(b), the resulting feedback signal exhibits frequency doubling if the laser center wavelength is aligned with the filter center wavelength; otherwise it generates a signal with the same dither frequency, which is either in phase (FIG. 4(a)) or out of phase (FIG. 4(c)) with the original dither modulation. It should be understood that, for the case where the laser center frequency is misaligned with the bandpass filter peak and yet there is exhibited partial overlap of the dither spectra through the bandpass filter peak (i.e., the centerpoint peak is traversed twice in a dither cycle), the PIN diode will detect partial frequency doubling at opposite phases depending upon whether the laser center frequency is inboard or outboard of the filter center frequency. Thus, even though partial frequency doubling is detected, it may still be detected from the feedback signal in which direction and magnitude the laser signal should be driven for alignment.

Thus, referring now to FIGS. 5(a) and 5(c), for the case when the laser and filter are not aligned, the cross product signal 42 resulting from the mixing of the amplified feedback error with the original dither sinusoid is a signed error signal either at a first polarity (for the laser signals at frequencies below the bandpass filter centerpoint), such as shown in FIG. 5(a) or, at a second polarity (for the laser signals at frequencies above the bandpass filter centerpoint), such as shown in FIG. 5(c). Each of these signals may be rectified and converted into a digital output laser bias voltage signal 48 as shown in respective FIGS. 6(a) and 6(c), which are fed back to respectively increase or decrease the laser current (wavelength) in such a way that the laser center wavelength moves closer to the bandpass filter centerpoint. For the case when the laser and filter are aligned, the cross product generated is the frequency doubled signal (twice the frequency of the dither) as shown in the figures.

Consequently, this results in a 0 V dc bias voltage (FIG. 6(b)) which will maintain the laser frequency centerpoint at its current wavelength value.

In order to describe further benefits of the invention, it is first noted that although it may appear that if a filter bandpass is larger than the laser linewidth, then the entire optical pulse will pass through the filter unaffected. However, this is clearly not the case; the laser spectra and filter function are both Gaussian, in both time and wavelength (reciprocal of frequency). Thus, passing the laser spectra through the filter results in a convolution between the spectrum and filter functions. Implementing analog signal processing, an output optical spectrum is produced which is actually narrower than the input spectra (i.e., some of the light is lost during filtering). In a real WDM system there may be at least two (2) bandpass filter devices in a link to perform multiplex/demux functions at either end: in practice, there may be many bandpass filters configured in series. This leads to a secondary problem: when two filters are in series and their bandpass centers are not aligned, the original signal must be convolved with both filter functions; this narrows the signal spectra even further, at the cost of lowering the optical power by discarding the edges of the light spectra. A succession of filters not aligned with each other can be shown to have the same characteristics as a single, much narrower, filter. This further reduces the margin for misalignment between the laser and multiple filters. For example, even if the ideal center to center, wavelength spacing of a WDM system is 0.8 nm, due to misalignment between the mux and demux filters this window may be reduced to approximately 0.4 nm or less. This would require extreme precision and stability for the laser wavelength, making for a very expensive laser transmitter. Thus, there are really two problems to be solved: (1) laser to filter alignment; and, (2) filter to filter alignment. Note that when signals propagate through a fiber optic network and traverse multiple filters the wavelength may shift due to these effects combined with temperature and environmental effects. It is a real, practical problem to keep an input wavelength the same throughout the network, so that network architectures such as ring mesh, wavelength reuse, and wavelength conversion may work properly, i.e., this is called frequency referencing.

The present invention addresses frequency referencing as it can handle both of these instances. For example, as shown in FIG. 8, there is depicted a general block diagram depicting the underlying system architecture employing the wavelength-locked loop technique in an optical system 10' employing a series connection of two bandpass filters 25a, 25b.

Figure 9:
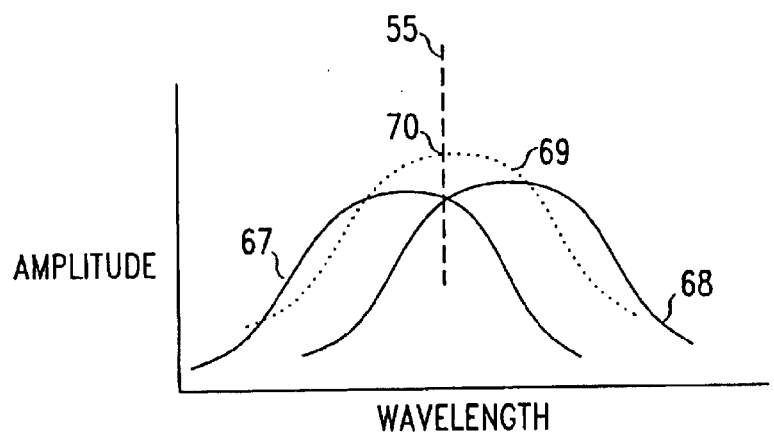
FIG. 9 is a signal waveform diagram depicting the relationship between laser optical power as a function of wavelength for the case of aligning a laser signal through a system including two bandpass filters in series, as depicted in FIG. 8.
Figure 8:
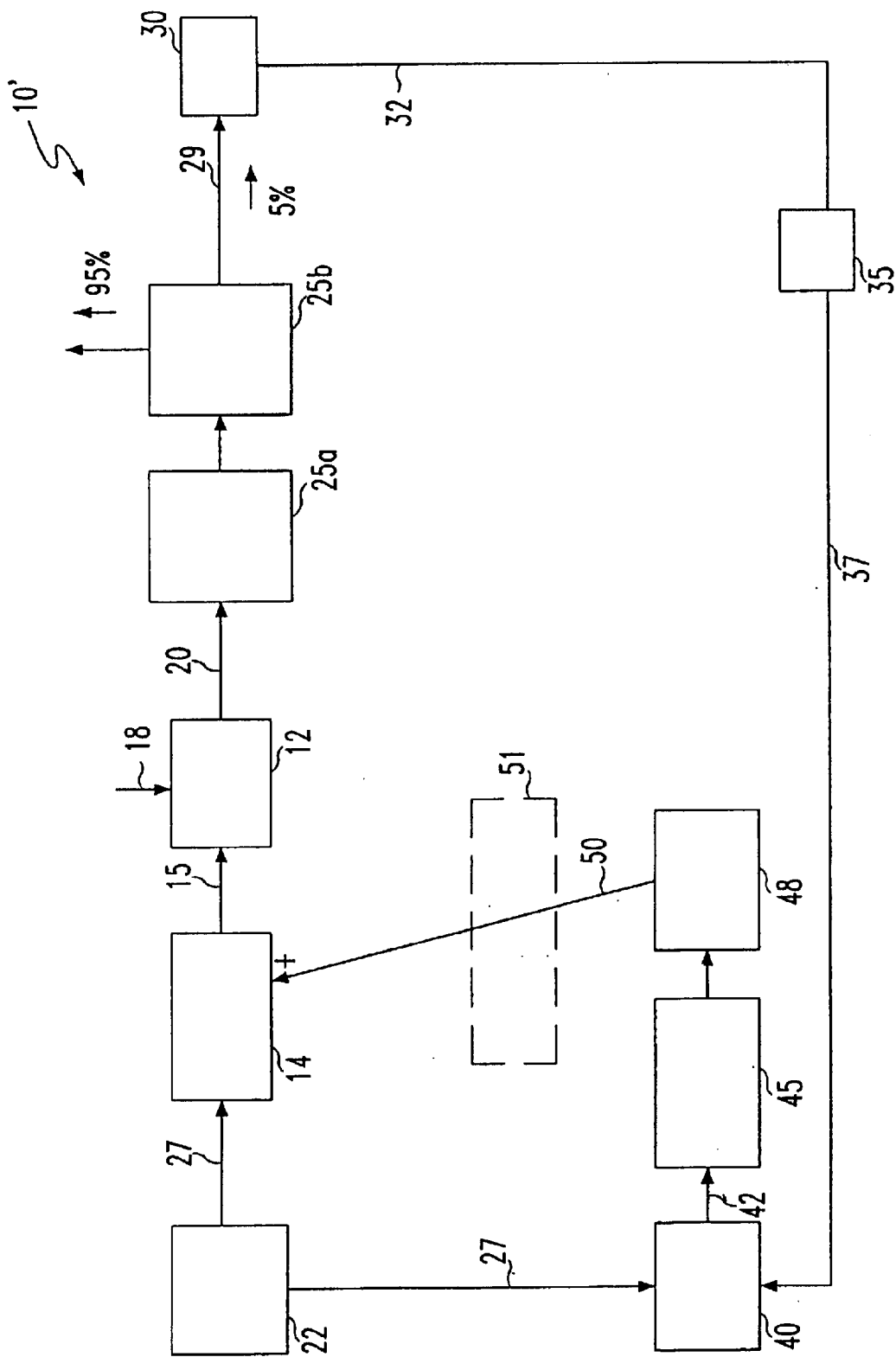
FIG. 8 is a general block diagram depicting the underlying system architecture for employing an optional wavelength shifter in the wavelength-locked loop technique, and also an optical system employing two bandpass filters according to the present invention.

FIG. 9 depicts each of the individual filter responses 67 and 68 for the two bandpass filters 25a, 25b of FIG. 8 and the corresponding composite filter response 69 having a centerpoint or peak 70. When performing filter to filter or multiple filter alignment, the technique of the invention depicted in FIG. 8 may be implemented to tune the laser signal 55 to have a center frequency such that maximum power transfer will occur through the series connection of two bandpass filters as represented by its composite filter response 69 (FIG. 9). Generally, a cascade of bandpass filters results in an effective narrowing of the overall passband, as the net filter response is a convolution of the component filter responses. The WLL can align the laser center wavelength with the middle of this composite passband.

Figure 10:
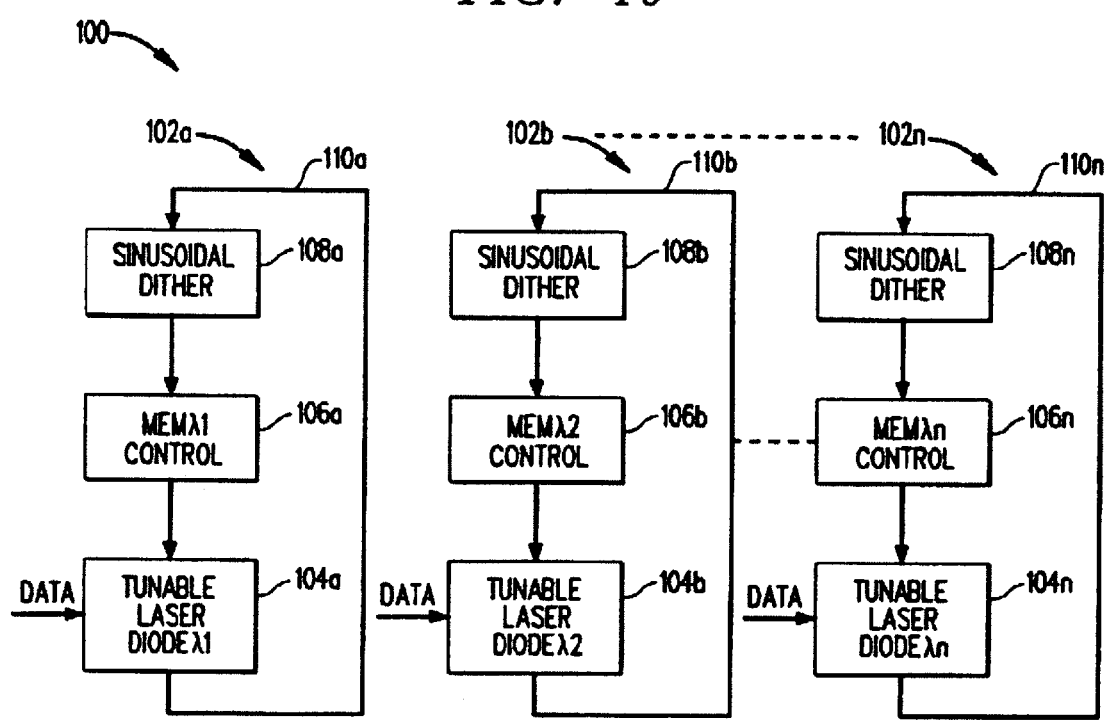
FIG. 10 illustrates a wavelength division multiplexing communication system having a plurality of different channels carrying a plurality of different wavelength signals, wherein each channel includes a separate laser, movably positioned MEM device and dither operated wavelength locked feedback loop.

FIG. 10 illustrates a wavelength division multiplexing communication system 100 having a plurality of different channels, 102a, 102b . . . 102n, carrying a plurality of different wavelength signals, $\lambda a, \lambda b \ldots \lambda n$, wherein each channel includes a separate laser, 104a, 104b . . . 104n, movably positioned MEM device, 106a, 106b . . . 106n, sinusoidal dither generator 108a, 108b . . . 108n and dither operated wavelength locked feedback loop 110a, 110b . . . 110n. The wavelength locked loop of the present invention enables a tighter control of wavelength, which allows an increased density of wavelength channels with less cross talk between channels in a wavelength multiplex system, which might typically include 32 or 64 channels or links.

The system and method of the present invention may be used to tune a laser wavelength to compensate for any type of wavelength-selective element in a network, including wavelength selective switches, tunable filters, in fiber Bragg gratings, ring resonators in optical amplifiers, external modulators such as acousto-optic tunable filters, or array waveguide gratings. This applies to many other optical components in the network as well (for example, optical amplifiers that can act as filters when operating in the nonlinear regime). This method may additionally be used to implement less expensive devices for all of the above application areas. As the optical loss of a WDM filter/laser combination is greatly reduced by implementing the technique of the invention, significantly larger link budgets and longer distances may be supported. Further, the invention permits much lower cost lasers and filters to be used; since these are the most expensive parts of a WDM device today, there is a significant cost reduction in the WDM equipment.

While several embodiments and variations of the present invention for micro-electromechanical devices for wavelength tunable lasers are described in detail herein, it should be apparent that the disclosure and teachings of the present invention will suggest many alternative designs to those skilled in the art.

What is claimed is:

1. An arrangement for tuning the wavelength of a laser having a micro-electro-mechanical (MEM) device to a desired wavelength comprising:

a laser defining a laser cavity;

a movably positionable MEM device having a mirror surface positioned relative to the laser cavity to reflect laser light generated by the laser, wherein the MEM device is movably positioned to tune the wavelength of the laser cavity;

a wavelength selective device implementing a peaked passband function including a center wavelength which is the desired wavelength, in a system employing the laser;

a dither generator for generating a sinusoidal dither signal at a dither frequency which is applied to the MEM device, wherein the position of the MEM device oscillates at the dither frequency which produces a periodic change in the length of the laser cavity and a corresponding change in the laser output wavelength which passes through the wavelength selective device;

a dither wavelength locked feedback loop for dynamically adjusting the position of the MEM device to maintain the laser output wavelength nominally centered at the desired wavelength;

a detector detects the laser output after the dithered laser output has passed through the wavelength selective device and produces a detector output signal;

a mixer wherein the detector output signal is mixed with the dither signal to produce an output cross product feedback signal which provides an indication of whether the laser wavelength is aligned with the center wavelength of the wavelength selective device, and if not provides an indication of what direction and by what amount the wavelength of the laser must be shifted to be brought into alignment with the center wavelength of the wavelength selective device.

2. The arrangement of claim 1 wherein the wavelength selective device is a bandpass filter for receiving and filtering the laser output, wherein the bandpass filter defines a bandpass center wavelength which is the desired wavelength.

3. The arrangement of claim 1, wherein the dither generator generates the sinusoidal dither signal at a frequency of several kHz or less.

4. The arrangement of claim 1, wherein the MEM device is positioned external to the laser cavity.

5. The arrangement of claim 1, in a wavelength division multiplexing communication system comprised of a plurality of separate different channels carrying a plurality of separate different wavelength signals, wherein each separate different channel is comprised of a separate different laser, a separate different movably positioned MEM device and a separate different dither operated wavelength locked feedback loop.

6. The arrangement of claim 1, wherein said wavelength selective device comprises multiple bandpass filters in series, said multiple bandpass filters exhibiting a composite filter response representing a passband center wavelength, wherein said laser output is tuned to said passband center wavelength so that signal power is maximally transmitted through said series of multiple bandpass filters.

7. The arrangement of claim 1, further including:
a low-pass filter for filtering said cross-product signal to produce a filtered cross-product signal; and
an integrator circuit for averaging said filtered cross-product signal to generate an error signal, wherein said error signal is positive or negative depending on whether a center wavelength of said laser output is respectively less than or greater than the desired wavelength of said wavelength selective device.

8. The arrangement of claim 7, further including a wavelength shifter for receiving said error signal and offsetting said error signal in an amount to offset the laser output wavelength in a predetermined manner.

9. A method for tuning the wavelength of a laser having a micro-electro-mechanical (MEM) device to a desired wavelength comprising:
movably positioning a MEM device having a mirror surface relative to the laser cavity of a laser to reflect laser light generated by the laser, to tune the wavelength of the laser cavity;
tuning the laser output with a wavelength selective device implementing a peaked passband function including a center wavelength which is the desired wavelength in a system employing the laser;
generating a sinusoidal dither signal at a dither frequency and applying the sinusoidal dither signal to the MEM device, wherein the position of the MEM device oscillates at the dither frequency which produces a periodic change in the length of the laser cavity and a corresponding change in the laser output wavelength which passes through the wavelength selective drive;
dynamically adjusting the position of the MEM device with a dither wavelength locked feedback loop to maintain the laser output wavelength nominally centered at the desired wavelength;
detecting the laser output after the dithered laser output has passed through the wavelength selective device and producing a detector output;
mixing the detector output is mixed with the dither signal to produce an output cross product feedback signal which provides an indication of wether the laser wavelength is aligned with the center wavelength of the wavelength selective device, and if not provides an indication of what direction and by what amount the wavelength of the laser must be shifted to be brought into alignment with the center wavelength of the wavelength selective device.

10. The method of claim 9, including tuning the laser output with a bandpass filter for receiving and filtering the laser output, wherein the bandpass filter defines a bandpass center wavelength which is the desired wavelength.

11. The method of claim 9, including generating the sinusoidal dither signal at a frequency of several kHz or less.

12. The method of claim 9, including positioning the MEM device external to the laser cavity.

13. The method of claim 9, utilized in a wavelength division multiplexing communication system which performs the steps of carrying a plurality of different wavelength signals in a plurality of different channels, and of movably positioning a different MEM device and dynamically adjusting the position of each different MEM device in each of the plurality of different channels.

14. The method of claim 9, including positioning multiple bandpass filters in series to form the wavelength selective device, said multiple bandpass filters exhibiting a composite filter response representing a passband center wavelength, and tuning the laser output to said passband center wavelength so that the signal power is maximally transmitted through said series of multiple bandpass filters.

15. The method of claim 9, further including:
filtering said cross-product signal to produce a filtered cross-product signal; and
averaging said filtered cross-product signal to generate an error signal, wherein said error signal is positive or negative depending on whether a center wavelength of said laser output respectively less than or greater than the desired wavelength of said wavelength selective device.

16. The method of claim 15, further including offsetting said error signal in an amount to offset the laser output wavelength in a predetermined manner.

* * * * *